(12) United States Patent
Bailey, III

(10) Patent No.: US 8,764,907 B2
(45) Date of Patent: Jul. 1, 2014

(54) SERVICING A PLASMA PROCESSING SYSTEM WITH A ROBOT

(75) Inventor: Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 22 days.

(21) Appl. No.: 12/569,674

(22) Filed: Sep. 29, 2009

(65) Prior Publication Data

US 2010/0024186 A1 Feb. 4, 2010

Related U.S. Application Data

(62) Division of application No. 11/092,848, filed on Mar. 28, 2005, now abandoned.

(51) Int. Cl.
*B23P 6/00* (2006.01)
*B23P 19/04* (2006.01)

(52) U.S. Cl.
USPC ....... 134/8; 901/1; 901/41; 134/2; 134/22.18; 134/22.19; 134/24; 216/67; 427/255.28

(58) Field of Classification Search
USPC ........................................ 216/67; 427/255.28
See application file for complete search history.

(56) References Cited

U.S. PATENT DOCUMENTS

| | | | |
|---|---|---|---|
| 4,594,111 A | 6/1986 | Coonan | |
| 4,610,075 A | 9/1986 | Erikssom | |
| 4,655,258 A * | 4/1987 | Breyer et al. | 139/1 C |
| 5,364,219 A | 11/1994 | Takahashi et al. | |
| 5,391,275 A | 2/1995 | Mintz | |
| 5,492,569 A * | 2/1996 | Nakada | 134/18 |
| 6,120,660 A | 9/2000 | Chu et al. | |
| 6,135,697 A | 10/2000 | Isaacs et al. | |
| 6,380,612 B1 | 4/2002 | Jang et al. | |
| 6,388,382 B1 | 5/2002 | Doi et al. | |
| 6,606,784 B1 * | 8/2003 | Huff et al. | 29/709 |
| 6,810,548 B2 | 11/2004 | Yoshioka et al. | |

(Continued)

FOREIGN PATENT DOCUMENTS

| EP | 261347 | 3/1988 |
| EP | 0801413 A | 10/1997 |

(Continued)

OTHER PUBLICATIONS

"Final Office Action", U.S. Appl. No. 11/092,848, Correspondence Date: Jul. 31, 2009.

(Continued)

*Primary Examiner* — Parviz Hassanzadeh
*Assistant Examiner* — Nathan K Ford

(57) ABSTRACT

A method for servicing a plasma processing system. The plasma processing system may include a plasma chamber. The plasma chamber may include a top piece and a bottom piece, wherein the top piece may be disposed above the bottom piece. The method may include using a robot device to control a lift mechanism to lift the top piece from the bottom piece. The method may also include extending a first member of the robot device into the top piece to perform a first set of tasks according to a first set of service procedures. The method may also include extending a second member of the robot device into the bottom piece to perform a second set of tasks according to a second set of service procedures.

20 Claims, 7 Drawing Sheets

(56) References Cited

U.S. PATENT DOCUMENTS

| | | | |
|---|---|---|---|
| 6,841,963 | B2 | 1/2005 | Song et al. |
| 6,919,913 | B1* | 7/2005 | Inada et al. .................... 348/61 |
| 6,973,856 | B2* | 12/2005 | Shibata .......................... 81/57.4 |
| 2001/0006094 | A1* | 7/2001 | Amano et al. ................ 156/345 |
| 2001/0006870 | A1 | 7/2001 | Moore |
| 2001/0029894 | A1 | 10/2001 | DeOrnellas et al. |
| 2002/0100557 | A1 | 8/2002 | Li et al. |
| 2002/0104751 | A1 | 8/2002 | Drewery et al. |
| 2002/0108634 | A1* | 8/2002 | McMullen ........................ 134/6 |
| 2002/0121291 | A1* | 9/2002 | Daum et al. ...................... 134/8 |
| 2002/0142611 | A1 | 10/2002 | O'Donnell et al. |
| 2003/0185655 | A1 | 10/2003 | Uchimaki et al. |
| 2003/0207655 | A1 | 11/2003 | Jackson |
| 2004/0060657 | A1 | 4/2004 | Saigusa et al. |
| 2004/0134518 | A1 | 7/2004 | Kraus et al. |
| 2004/0134519 | A1 | 7/2004 | Jung et al. |
| 2005/0014380 | A1 | 1/2005 | Kai et al. |
| 2005/0225248 | A1 | 10/2005 | Fink et al. |
| 2005/0241669 | A1 | 11/2005 | Wodecki |
| 2006/0130758 | A1 | 6/2006 | Lohokare |
| 2006/0218680 | A1 | 9/2006 | Bailey, III |
| 2007/0034604 | A1 | 2/2007 | Vahedi et al. |

FOREIGN PATENT DOCUMENTS

| | | |
|---|---|---|
| JP | 03-185824 | 8/1991 |
| JP | 6272027 A | 9/1994 |
| JP | 08-031906 | 2/1996 |
| JP | 08-051098 | 2/1996 |
| JP | 08-330387 | 12/1996 |
| JP | 2003-173978 | 6/2002 |
| JP | 2003311555 A | 11/2003 |
| WO | WO-03/029513 | 4/2003 |

OTHER PUBLICATIONS

"First Office Action", CN Application No. 200680010522.3, Mailing Date: Sep. 4, 2009.
"Second Office Action", CN Application No. 200680010522.3, Mailing Date: Jul. 29, 2010.
"First Office Action": CN Application No. 200580047522.7, Mailing Date: Jun. 1, 2010.
"Notice of Allowance", Issued in U.S. Appl. No. 11/022,982; Mailing Date: Jan. 12, 2011.
"International Search Report", Issued in PCT Application No. PCT/US2005/45729; Mailing Date: May 28, 2008.
"International Preliminary Report on Patentability", Issued in PCT Application No. PCT/US2005/045729; Mailing Date: Jul. 17, 2008.
"Written Opinion", Issued in PCT Application No. PCT/US2005/45729; Mailing Date: May 28, 2008.
"Final Office Action", U.S. Appl. No. 11/022,982, Mailing Date: Nov. 3, 2008.
"Non Final Office Action", U.S. Appl. No. 11/022,982; Mailing Date: May 13, 2008.
"International Search Report", Issued in PCT Application No. PCT/US2006/10577; Mailing Date: Sep. 13, 2007.
"Written Opinion", Issued in PCT Application No. PCT/US2006/10577; Mailing Date: Sep. 13, 2007.
"International Preliminary Report on Patentabiiity", Issued in PCT Application No. PCT/US2006/10577; Mailing Date: Oct. 18, 2007.
"Final Office Action", U.S. Appl. No. 11/092,848; Mailing Date: Sep. 15, 2008.
"Non Final Office Action", U.S. Appl. No. 11/092,848, Mailing Date: Mar. 11, 2008.
"Non Final Office Action", U.S. Appl. No. 11/092,848, Mailing Date: Jun. 13, 2007.
"Final Office Action", U.S. Appl. No. 11/092,848, Mailing Date: Oct. 3, 2007.
"Non Final Office Action", U.S. Appl. No. 11/022,982, Mailing Date: Dec. 31, 2008.
"Non Final Office Action", U.S. Appl. No. 11/092,848, Mailing Date: Feb. 25, 2009.
Siegerman, Howard "Applying Process-Specific Approaches to Performing Tool Preventive Maintenance", http://www.micromagazine.com/archive/01/10/tool.html, Jan. 16, 2005, Los Angeles, Ca, 9pp.
Anonymous "Robotic Assembly for the 21st Century", Automation Technologies Council, Ann Arbor, MI, Feb. 9, 2006, 16pp.
Derby et al., "A High Precision Robotic Docking End Effector: The Dockbot", Distributed Robotics LLC, Troy, NY, 2002, 8 pp.
Anonymous "Introduction to Industrial Robots", Warwick Manufacturing Group, 1993, 10pp.
Anonymous "Characteristics Arm-TX Series 40 Family", 2004 Staubli Faverges, 2005, pp. 1-34.
The University of South Florida, "Module 3 Robotics Technology", NSF/USF Stars, Feb. 6, 2006, Tampa, FL, 7pp.
Barnes, Nick "Docking", http://homepages.inf.ed.ac.uk/rbf/CVonline/LOCAL_COPIES/BARNES, Jan. 17, 2005, 6pp.
Helpmate Robotics, Inc., "Robot Navigation Technology", Helpmate Robotics, Inc., http://statusreports.atp.nist.gov/reports/91-01-0034.htm, Mar. 1999, 3 pp.
Anonymous "Chapter 1: Introduction", Aug. 17, 2000. pp. 1-32.
Anonymous "Chapter 2: The Manufacturing Process", Sep. 4, 2000, pp. 33-62.
Anonymous "Chapter 3: the Devices", Sep. 6, 1999, pp. 43-97.
Anonymous "Chapter 4: The Wire", Sep. 6, 1999, pp. 103-143.
Anonymous "Chapter 5: The CMOS Inverter", Sep. 6, 1999, pp. 144-192.
Labombard et al., "Cross-field Plasma Transport and Main-chamber Recycling in Diverted Plasmas on Alcator C-Mod", http://epub.iaea.org/fusion/subscribe/40/dec/ms6940LabomB/6940.html, Cambridge, MA, Oct. 17, 2004, 28 pages total.
Rees et al., "Processing Plasmas Face a Testing Time", Oct. 24, 2004, 4 pages total.
Carter, William P., "Research Plan for Next Generation Environmental Chamber Facility for Chemical Mechanism and VOC Reactivity Evaluation", Riverside, CA, pp. 1-19.
Chang et al., "Plasma-surface Interactions", J. Vac. Sci. Technol. A 21(5), Sep. 2, 2003, pp. S145-S151.
Anonymous "Alternative Discharges: Fields and Waves", TimeDomain CFD Inc., http://www.timedomaincvd.com/CVD-Fundamentals/plasmas/Other_plasmas.html, Oct. 17, 2004, 5 pages total.
May, Paul "MSc Physics of Advanced Semiconductor Materials: Plasmas and Plasma Processing", Oct. 25, 2004, 9 pages total.
City University of Hong Kong, "Chapter 3: Epitaxy", City University of Hong Kong, Nov. 30, 2004, Hong Kong, China, pp. 1-24.
Sobolewski et al., "Electrical Optimization of Plasma-enhanced Chemical Vapor Deposition Chamber Cleaning Plasmas", J. Vac. Sci. Technol. B 16(1), Jan./Feb. 1998, pp. 173-182.
Chu, Paul "Chapter 10: Metallization", City University of Hong Kong, Nov. 30, 2004, Hong Kong, China, 51 total pages.
Nelson et al., "Yttrium Oxide Nanoparticles prepared by Alkalide Reduction", Chem. Mater., vol. 14 No. 2, Jan. 3, 2002, pp. 915-917.
Horiuchi et al., "In-Situ Chamber Wall Cleaning in Processing Plasmas", Tohuku University, Nov. 30, 2004, Sendai, Japan, 4 pages total.
Johnson et al, "Reducing PFC Gas Emissions from CVD Chamber Cleaning", Solid State Technology, Dec. 2000 Edition, Allentown, PN, 6 pages total.
Chu et al., "Third-generation Plasma Immersion Ion Implanter for Biomedical Materials and Research", Review of Scientific Instruments, vol. 72, No. 3, Mar. 2001, pp. 1660-1665.
Anonymous "Chapter 9: Trench Filing by Physical Vapor Deposition", http://www.ipm.virginia.edu/research/PVD/Pubs/yang_thesis/ch9.pdf, Aug. 6, 2005, pp. 138-173.
Dobkin, Daniel M., "Plasmas and Deposition", http://www.batnet.com/enigmatics/semiconductor_processing/CVD_Fundamentals/plasmas/plasma_deposition.html, Oct. 17, 2004, 4 pages total.
Anonymous "Hydrogen Peroxide (H2O2): The Amazing Secrets That THEY Don't Want You to Know!",http://www.h2o2-4u.com, Aug. 13, 2003, 6 pages total.
Harpold et al., "How Advanced Energy, MDX TM Products Manage Arcs", Advanced Energy, Fort Collins, CO, Aug. 6, 2005, pp. 1-8.

(56) References Cited

OTHER PUBLICATIONS

Montgomery, Steven "Higher Profits from Intelligent Semiconductor Equipment Maintenance: 'The Source of the Maintenance Problem'", Future Fab International, Issue 17, http://www.future-fab.com/documents.asp?d_ID=1226, Feb. 11, 2000, 7 pages total.

Rossnagel, S.M., "Sputter Deposition for Semiconductor Manufacturing", IBM Journal of Research and Development, vol. 14, 1/2, http://www.research.ibm.com/journal/rd/431/rossnagel.html, Armonk, New York, Mar. 20, 1998, pp. 1-14.

Nickerson et al., "Plasma Cleaning of Medical Devices", Jun. 2000, 4 total pages.

Friz et al., "Coating Materials", Jun. 12, 2003, Gemshein, Germany, pp. 105-130.

Anonymous, "Section 4: Examples of Waste Minimization/Pollution Prevention Techniques", http://www.p2pays.org/ref/02/01844/sec_4.txt, Oct. 4, 2004, pp. 1-26.

Yeoh et al., "Photoresist Strip on Orion 2.2 TM in Via First Dual Damascene Cu Structures", Trikon Technologies, New Port, South Wales, Nov. 30, 2004, 3 pages total.

Anonymous, "The Self Clean Chemistry Concept (I)", No Publication or Website known, Nov. 12, 2004, 1 page total.

Yang, Yao-Joe "Thin Film Process", 11 pages total, 21 slides, Nov. 30, 2004.

Anonymous, "Evaporation", Sep. 21, 2001, 26 slides, 7 pages total.

"Final Office Action", U.S. Appl. No. 11/022,982, Correspondence Date: Jul. 14, 2010.

\* cited by examiner

SERVICING A PLASMA PROCESSING SYSTEM WITH A ROBOT

CROSS-REFERENCE TO RELATED APPLICATIONS/PRIORITY CLAIM

This application is a divisional application of and claims the benefit under 35 U.S.C. 120 of U.S. patent application Ser. No. 11/092,848 ("APPARATUS FOR SERVICING A PLASMA PROCESSING SYSTEM WITH A ROBOT") filed on Mar. 28, 2005 now abandoned by Andrew D. Bailey III.

BACKGROUND OF THE INVENTION

The present invention relates in general to substrate manufacturing technologies and in particular to an apparatus for servicing a plasma processing system with a robot.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar clamping electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $SO_2$, $BCl_3$, $Cl_2$, $SiCl_4$ etc.) are then flowed into the chamber and struck to form a plasma to etch exposed areas of the substrate.

However, in the normal course of operation, a plasma processing system may need to be serviced with a set of pre-defined service procedures. For example, the plasma chamber may need to be cleaned, or a plasma chamber part may need to be removed, placed, or aligned. In addition, servicing a plasma processing system may also expose an operator to hazardous duty (i.e., exposure to toxic gases or high temperatures, lifting heavy parts, etc.).

For example, pollutants or byproducts that are detrimental to the substrate may need to be cleaned from plasma chamber surfaces. Generally, volatile byproducts may be easily removed from the plasma chamber by a vacuum system, and hence tend to be less problematic. However, non-volatile byproducts will tend to be deposited on exposed surfaces within the plasma chamber or in the vacuum system. Comprised of organic and inorganic byproducts, these non-volatile byproducts are commonly generated from materials in the etchant gases (e.g., carbon, fluorine, hydrogen, nitrogen, oxygen, argon, xenon, silicon, boron, chlorine, etc.) and from materials in the substrate (e.g. photoresist, silicon, oxygen, nitrogen, aluminum, titanium, copper, platinum, iridium, iron, nickel, tantalum, etc.).

In addition, as physical structures within the chamber (e.g., chuck, chamber walls, etc.) are exposed to the plasma, they also tend to produce additional non-volatile byproducts either from their major constituents or impurities in their structure (e.g., aluminum, nickel, iron, tantalum, yttrium, silicon, carbon, titanium, magnesium, manganese etc.). For example, some components, such as the chuck, may become substantially etched in the process by which pollutants are partially and quickly cleaned from the plasma processing system, by striking the plasma without the substrate in a process called waferless auto clean or WAC. Repeated plasma exposure tends to physically alter structures, such as by surface chemical composition, morphology, physical dimensions, etc. In each case, these eroding atoms typically are volatile and pumped away or redeposit elsewhere in the chamber or on the substrate.

The degree of deposit adhesion to surfaces within the chamber, and hence the subsequent degree of potential contamination, is usually dependent on the specific plasma processing recipe (e.g., chemistry, power, and temperature), the specific operating procedure of the non-processing steps (e.g., substrate transfer methods, vacuum system transitions, periodic in situ cleans etc.), the geometry of the system and substrate components and the initial surface condition of chamber process kits. In general, organic bonds tend to be very strong and adhesive (i.e., C—H, C—C, C=C, C—O, C—N, etc.), since cross-linked relatively stable strictures are created. The addition of metallic atoms from any of the sources mentioned above will often exacerbate the cleaning problem by formation of metallic, metal-organic compounds or metal oxides or mixtures thereof. In addition, when these non-volatile byproducts eventually flake, they may subsequently increase the susceptibility of substrate defects, reduce the mean time between cleaning (MTBC), reduce yield, lead to unacceptable atomic surface contamination on the substrate, etc. For example, depending on the plasma process, conductive film of byproducts may form on plasma chamber interior surfaces which may impact the FW coupling of the plasma source and bias.

In operation, since substantially removing the byproducts may be time consuming, a plasma chamber is generally substantially cleaned only when, or preferably just before, particle contamination levels reach unacceptable levels, when the plasma processing system must be opened to replace a consumable structure (e.g., edge ring, optical access windows, etc.), or as part of scheduled preventive maintenance (PM). In general, experience has shown that servicing plasma processing equipment on a scheduled basis minimizes unscheduled downtime, smoothes production scheduling, improves yields, and extends the intervals between servicing.

In a typical preventive maintenance that includes a set of pre-defined service procedures, the plasma chamber is opened by an operator, wherein structures such as chamber walls, shields, gas distribution rings, showerheads, substrate support assemblies, robotic arms, and other accessible hardware may be either manually cleaned in place by the operator, or removed and replaced with a clean set of components.

Removable plasma chamber components (i.e., chuck, quartz ring, etc.) are often transported to a cleaning station somewhere else in the fabrication facility. Non-removable components (i.e., chamber walls, etc.) by definition cannot be removed, and hence must be physically cleaned at the plasma processing equipment location.

In a typical cleaning process, chamber components are exposed to various cleaning solutions and physically rubbed with a cleaning object (i.e., a sealed-border knitted polyester wiper, an abrasive pad, etc.) in order to remove deposit adhesion. In a common technique, the removable component is exposed to a solution comprising an oxidizer, such as $H_2O_2$ and ly rubbed to loosen by-product deposits. The removable component is then rinsed with DI (de-ionized) water, and dried by a filtered inert gas, such as nitrogen. The structure is then ultrasonically cleaned with a keytone reagent, such as acetone, and again periodically rubbed.

Since much of the cleaning process is manual, the effectiveness of the clean is directly related to the skill of the cleaning technician, and the degree to which the technician adheres to the vendor recommended cleaning process. The vendor, having designed the plasma process system, and being aware of stringent part specifications, is generally in the best position to determine the optimum cleaning technique for a given manufacturing process. For example, part specifications may include the material properties of a part in relationship with another part or process parameter, the shape of the part, the power deposition profile between a set of parts for a given period of time, the location of a part within the plasma chamber, the expected wear of the part, temperature and temperature transients, etc.

However, customers may become complacent, or may instead only focus on maximizing equipment production time, and not on the performance of a thorough cleaning, which may amount to many thousands of dollars per hour in lost production time. For examples, operators who are not properly monitored can create problems by modifying the cleaning method, such as by eliminating steps, doing a less than thorough job in cleaning deposit adhesion or attempting to improve the procedure without verifying compatibility or effectiveness with the recommended processes. Subsequently, incomplete or incompatible cleaning can cause the plasma processing system to fail particle checks during substrate processing re-qualification or after processing has resumed, requiring additional unplanned maintenance and downtime.

In view of the foregoing, there are desired an apparatus for servicing a plasma processing system with a robot.

SUMMARY OF THE INVENTION

The invention relates, in one embodiment, to a robot apparatus for executing a set of service procedures on a plasma processing system including a docking port. The apparatus includes a platform and a docking probe coupled to the platform, wherein the docking probe is configured to dock with the docking port. The apparatus also includes a robot arm coupled to the platform, and further configured to substantially perform the set of service procedures, and a tool coupled to the robot arm. The apparatus further includes a computer coupled to the platform, wherein the computer is further configured to execute the set of service procedures, and wherein when the docking probe is docked to the docking port, the set of service procedures is performed by the tool.

The invention relates, in another embodiment, to a robot apparatus for a plasma processing system including a set of plasma chamber surfaces and a docking port. The apparatus includes an ambulatory platform, and a docking probe coupled to the ambulatory platform, wherein the docking probe is configured to dock with the docking port. The apparatus also includes a jointed arm coupled to the ambulatory platform, and further configured to substantially remove a set of byproduct deposits from the set of plasma chamber surfaces, and a tool coupled to the jointed arm. The apparatus further includes a computer coupled to the ambulatory platform, wherein the computer is further configured to execute a set of cleaning procedures, and wherein when the docking probe is docked to the docking port, the a set of byproduct deposits are substantially removed.

The invention relates, in another embodiment, to a robot apparatus for a plasma processing system including a set of plasma chamber surfaces and a docking port. The apparatus includes a jointed arm coupled to the plasma processing system, and further configured to substantially clean the set of plasma chamber surfaces, wherein the jointed arm has at least five degrees of freedom, and a tool coupled to the jointed arm. The method also includes a computer coupled to the plasma processing system, wherein the computer is further configured to execute a set of cleaning procedures, wherein when the set of cleaning procedures is executed, the set of plasma chamber surfaces is substantially cleaned.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
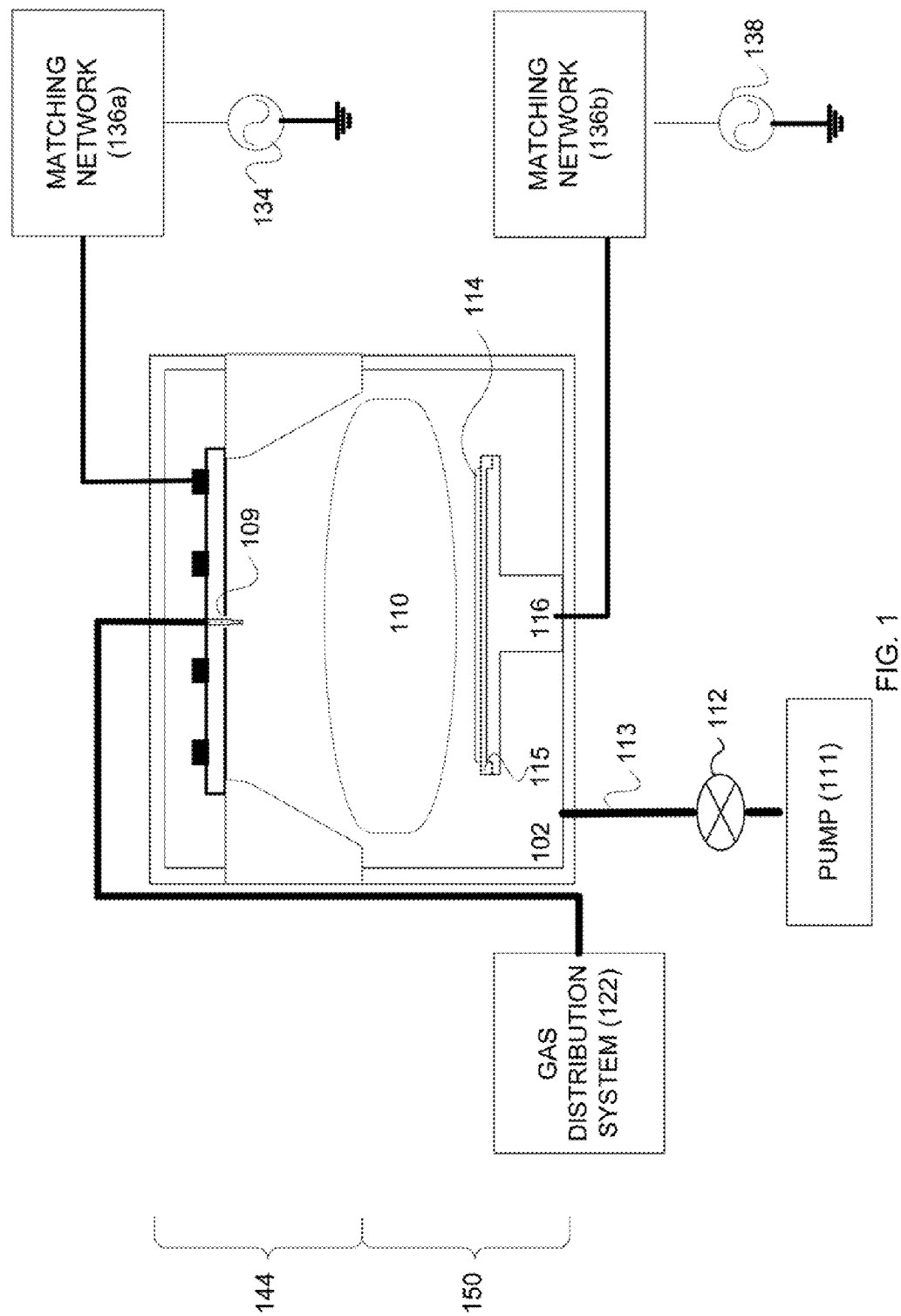
FIG. 1 illustrates a simplified diagram of an inductively coupled plasma processing system.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a robot device can perform a set of service procedures on a plasma processing system. As previously described, in the normal course of operation, a plasma processing system may need to be serviced with a set of pre-defined service procedures. For example, the plasma chamber may need to be cleaned, or a plasma chamber part may need to be removed, placed, or aligned. In addition, servicing a plasma processing system may also expose an operator to hazardous duty (i.e., exposure to toxic gases or high temperatures, lifting heavy parts, etc.).

However, for example, instead of being manually cleaned by an error-prone operator, portions of the plasma chamber may be cleaned in place by a robot device which uses the proper cleaning material and cleaning method (i.e. correct pressure, correct abrasive, correct solvent, correct coverage etc.). By substantially removing human error and variability, the plasma chamber may be returned back to operational status with a lower MTTC (mean time between cleaning) and MTTR (mean time to replacement) post clean.

In an embodiment, the plasma chamber is opened by the operator. In an embodiment, the plasma chamber is opened by a robot device. In an embodiment, the robot may be coupled to a platform that may need to be manually transported and docked to an appropriate plasma chamber by an operator.

In an embodiment, the robot can automatically transport itself to the appropriate plasma chamber. The robot device may be coupled to an ambulatory platform, such as a wheeled platform, robot arm, fixed frame or other construction that transports and docks the robot to the appropriate plasma chamber and is capable of interacting with its environment.

In general, docking is essential for a mobile robot that is required to perform precise interactions, ensuring proper orientation between the robot and the processing system. Docking can be defined as moving from the current position to a desired position and orientation, while following a safe trajectory. The final position and orientation of the robot should be adequate for the tolerances required by the particular task. In practice, docking is difficult without a sufficient number of reference points designed into plasma chamber components, or as part of manual and automated cleaning procedures.

In an embodiment, the docking mechanism uses a ball and detent method. In an embodiment, the docking mechanism uses spring-loaded rollers similar to many kitchen cabinet latches. In an embodiment, the docking mechanism uses permanent magnets and steel plates. In an embodiment, the docking mechanism uses electromagnets and steel plates. In an embodiment, the docking mechanism uses physical latches either planar or non planar. In an embodiment, the docking mechanism uses threaded socket latches. In an embodiment, the docking mechanism uses optical pattern recognition of a target or targets on one or more of the joint robot-module system. In an embodiment the docking mechanism includes peg and hole type features for the robot-module system to calibrate their relative locations prior to cleaning or moving to the cleaning process.

In an embodiment, the robot device can operate substantially continuously for about 24 hours per day without operator assistance. In an embodiment, the robot may be manually started on a series of automated tasks requiring operator verification of completion.

In an embodiment, the ambulatory platform includes a container, accessible to a robotic arm, and used to robotically store and replace contaminated and cleaned plasma chamber parts. For example, the robot arm may be a plate with three hooks to vertically pick up a very thick focus ring past a very thick ESC base where the tolerance between the parts is typically very tight, hence avoiding the human difficulty of binding parts in such a situation. In the future, as wafer sizes increase, such parts may in fact become ergonomically difficult to manually handle either because of their increased size, increased weight, increased tightness of tolerance, or any combination of attributes. A robotic implementation may not face such restrictions due to designed superior force and or precision.

In general, the use of a robot device may allow the design of plasma chamber parts that are operationally desirable (i.e., lower consumption, better electrical property, etc.) but less human friendly (i.e., heavier, lack of grip handles, tighter fittings, hazardous materials etc.). In addition, a robot device could automatically and correctly 'clock' wearing parts that physically need periodic adjustment for optimal substrate processing, but that often cannot be reliably positioned by a human operator due to lack of clear clocking markings, inattention of the operator, difficulty in tracking the required adjustment etc., robot device could finely align parts that need precise alignment, but for which alignment notches or grooves are undesirable for other reasons (i.e., contact avoidance, deposition localization, etc.).

For example, the ambulatory platform may include sensors that sense light, calculates direction, and determines the range to objects in its path. In addition, data from different sensors may be combined in order to permit the control of the robot device in quasi-structured environments, such as a semi-conductor manufacturing bay, with predefined components such as doorways, vacuum systems, worktables, and plasma chambers that are fixed in place and definable from engineering drawings and among objects that are not predefined, such as an operator or other robot device.

In an embodiment, the robot is transported by an operator to the appropriate plasma chamber. In an embodiment, the robot is continuously coupled to the plasma chamber.

In an embodiment, the robot device includes a computer with a set of operating software programs that direct the robot device to perform a set of service procedures. The robot device subsequently may be coupled to the plasma processing system itself, through a data port, such as an Ethernet or similar connection. In an embodiment, the robot device can be quickly reprogrammed, as more optimized cleaning methods are determined.

For example, a server with a database of plasma processing system schematics and cleaning procedures may be remotely located on a network accessible in the manufacturing facility. After the robot device docks to the appropriate plasma chamber, the server transmits the latest schematic and appropriate cleaning methods. In an embodiment, the transmission occurs through the data port. In an embodiment, the transmission occurs through a wireless connection, such as 802.11.

In an embodiment, a plasma processing system operator can program a set of service procedures directly into the robot device. In an embodiment, an operator can program a set of service procedures while the robot device is coupled to the plasma processing system.

Subsequently, any abnormalities that are observed by sensors in the robot device (i.e., excessive surface wear, damaged parts, misaligned or mis-positioned parts, etc.) may then be transmitted back to the server for further analysis and/or escalation. In an embodiment, the server is located in the substrate manufacturing facility. In an embodiment, the server is not located in the substrate manufacturing facility, but is accessible across the Internet. For example, the server may be located at the plasma processing system vendor.

As previously stated, in a typical preventive maintenance set of service procedures, the plasma chamber is manually opened, (i.e., an operator controls a product hoists to lift the top piece from the bottom piece, etc.), wherein chamber walls, shields, gas distribution rings, showerheads, substrate support assemblies, robotic arms, and other accessible hardware may be either cleaned in place or removed and replaced with clean components.

However, in a non-obvious way, a robot device can be programmed to follow the vendor's recommended byproduct cleaning method without substantial variance. For example, the robot device can grip the wiper, add the appropriate cleaning solution, and rub the wiper against the appropriate plasma chamber surface with the correct pressure and for the proper amount of time, thus, minimizing costly machine downtime. In addition, with proper safety precautions (i.e., sufficient shields to prevent dangerous or inappropriate human intervention), the robot device may itself automatically control the hoist lift mechanism that lifts the top piece from the bottom piece.

In an embodiment, the robot device may be physically trained. That is, the robot device may be taken offline and placed in a learning mode in which any movement of the jointed arm in the plasma chamber by an operator will be remembered by the robot device. These raw movements can then be further programmatically modified to produce an optimized cleaning method. This method of training may be beneficial to speed introduction of new or more complicated cleaning arm trajectories.

In one embodiment, the robot device can clean both the removable plasma chamber components (i.e., chuck, quartz ring, etc.) and the non-removable components (i.e., chamber walls, etc.) at the plasma processing equipment location. In an embodiment, the robot device cleans only non-removable components (i.e., chamber walls, etc.) at the plasma processing equipment location, while exchanging and replacing removable components with a corresponding clean set of components. In an embodiment, the robot device cleans only non-removable components (i.e., chamber walls, etc.) at the plasma processing equipment location, while the operator exchanges and replaces removable components with a corresponding clean set of components.

In an embodiment, the robot device may clean the plasma chamber and plasma chamber components with substances that are normally to dangerous for an operator. In an embodiment, the robot device may clean the plasma chamber and plasma chamber components with specified number of physical passes on or over the surface. In an embodiment, the robot device may clean the plasma chamber and plasma chamber components with a pressure sensitive feedback loop on the robot end effector to apply a known, constant force in a constant direction or speed.

In an embodiment, the robot device may clean the plasma chamber and plasma chamber components with feedback diagnostic limits for when to stop the clean, for example a clock timer (e.g., clean until operator stops or set time expires), a friction measurement (e.g., clean until the measured friction between the cleaning pad and surface becomes less than some specified value), an optical limit (e.g., clean until reflectance exceeds a limit, until a reference sample color is matched or until a reflectometric signal such as an interference fringe is no longer detected).

Referring now to FIG. 1, a simplified diagram of an inductively coupled plasma processing system is shown. Generally, the plasma chamber (chamber) 102 is comprised of a bottom piece 150, a top piece 144. An appropriate set of gases may be flowed into plasma chamber 102 from gas distribution system 122. These plasma processing gases may be subsequently ionized at or in a region near injector 109 to form a plasma 110, in order to process (e.g., etch or deposition) exposed areas of substrate 114, such as a semiconductor substrate or a glass pane, positioned with edge ring 115 on an electrostatic chuck 116.

A first RF generator 134 generates the plasma as well as controls the plasma density, while a second RF generator 138 generates bias RF, commonly used to control the DC bias and the ion bombardment energy. Further coupled to source RF generator 134 is matching network 136a, and to bias RF generator 138 is matching network 136b, that attempt to match the impedances of the RF power sources to that of plasma 110. Furthermore, vacuum system 113, including a valve 112 and a set of pumps 111, is commonly used to evacuate the ambient atmosphere from plasma chamber 102 in order to achieve the required pressure to sustain plasma 110.

Figure 2:
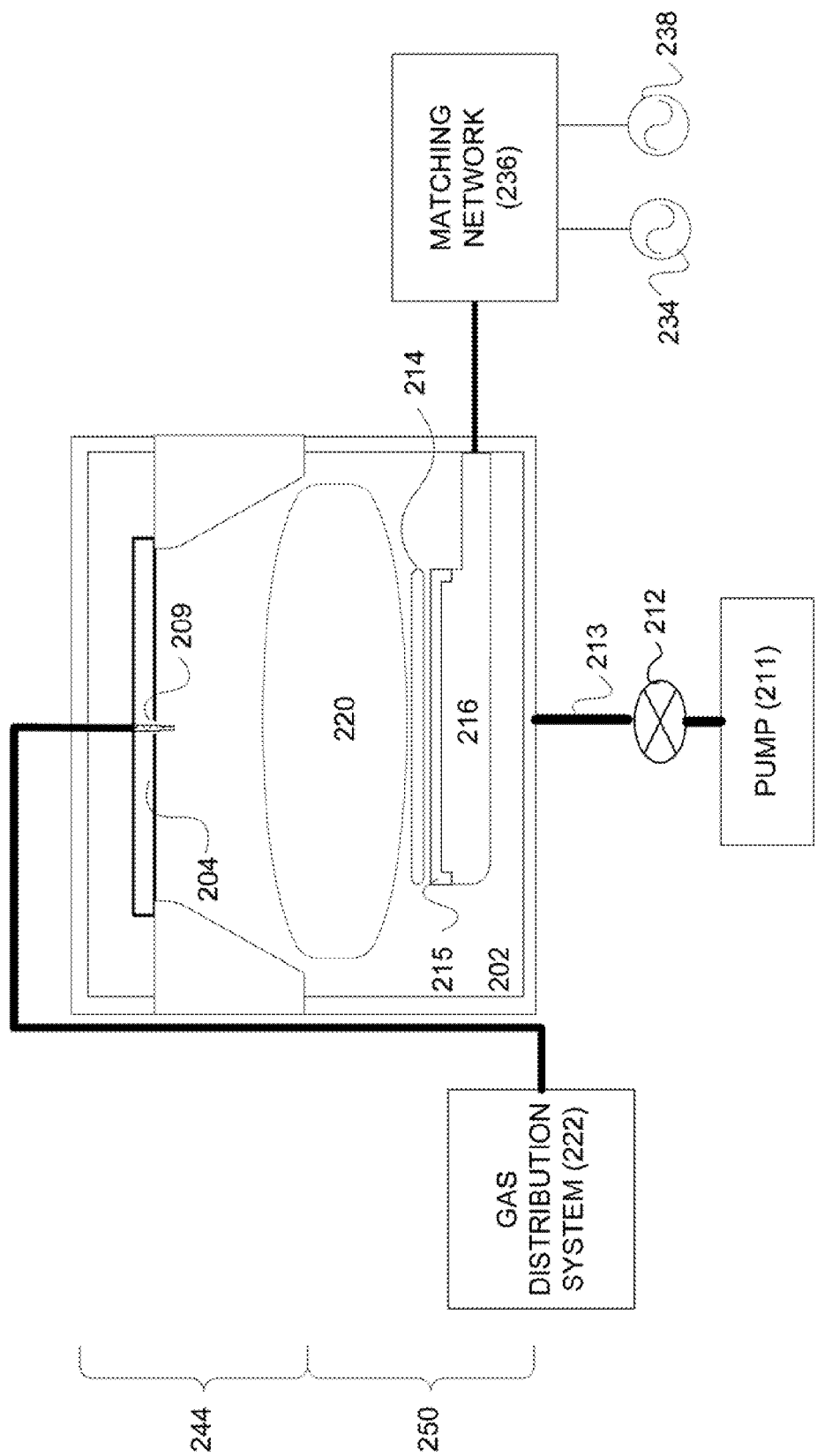
FIG. 2 illustrates a simplified diagram of a capacitively coupled plasma processing system.

Referring now to FIG. 2, a simplified diagram of a capacitively coupled plasma processing system is shown. Generally, the plasma chamber (chamber) 202 is comprised of a bottom piece 250, a top piece 244. Capacitively coupled plasma processing systems may be configured with a single or with multiple separate RF power sources. Source RF, generated by source RF generator 234, is commonly used to generate the plasma as well as control the plasma density via capacitively coupling. While bias RF, generated by bias RF generator 238, is commonly used to control the DC bias and the ion bombardment energy. Further coupled to source RF generator 234 and bias RF generator 238 is matching network 236, that attempts to match the impedance of the RF power sources to that of plasma 220. Other forms of capacitive reactors have the RF power sources and match networks connected to the top electrode 204. In addition there are multi-anode systems such as a triode that also follow similar RF and electrode arrangements.

Generally, an appropriate set of gases is flowed into plasma chamber 202 through an inlet in a top electrode 204 from gas distribution system 222. These plasma processing gases may be subsequently ionized to form a plasma 220, in order to process (e.g., etch or deposition) exposed areas of substrate 214, such as a semiconductor substrate or a glass pane, positioned with edge ring 215 on an electrostatic chuck 216, which also serves as an electrode. Furthermore, vacuum system 213, including a valve 212 and a set of pumps 211, is commonly used to evacuate the ambient atmosphere from plasma chamber 202 in order to achieve the required pressure to sustain plasma 220.

Figure 3:
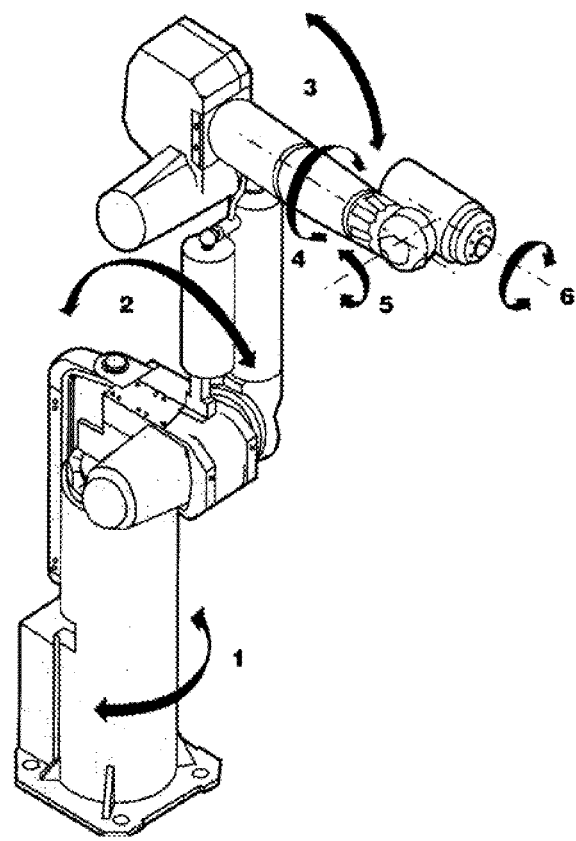
FIG. 3 illustrates a jointed arm, resembling a human arm, as may be used in the robot device, according to one embodiment of the invention.

Referring now to FIG. 3, a jointed robot arm, resembling a human arm, as may be used in the robot device is shown, according to one embodiment of the invention. In general, a jointed arm may achieve any position and orientation within the working envelope in eight degrees of freedom. A degree of freedom is generally defined as the direction in which a robot moves when a joint is actuated. Each joint usually represent one degree of freedom.

In practice, the greater the task complexity, the more degrees of freedom required. Simple implementations may require a very small number of degrees of freedom. For example, if a human operator assists the robot device by moving plasma chamber parts, a robot arm with fewer degrees of freedom may be used. In an embodiment, the jointed robot arm has at least five degrees of freedom. In an embodiment, the jointed arm has less than five degrees of freedom.

For example, changing a focus ring on a vertically moving electrode system may only require a properly aligned robot to have a single translational degree of freedom. First, the chuck is moved to place ring slots in proper vertical position. Next, the robot vertically positions its axis in line with chuck center. Next, the robot extends a robot arm, changing the chuck position, and dropping off a focus ring. Finally, the robot arm is retracted thus removing the focus ring.

In one embodiment, the jointed arm robot further includes a tool that may be used to perform some function. In an embodiment, the tool is changeable. In an embodiment, the tool includes a finger gripper. Generally, the most commonly used grippers are finger grippers. These will generally have two opposing fingers or three fingers like a lathe chuck. The fingers are driven together such that once gripped any part is centered in the gripper. Two finger grippers can be further split into parallel motion or angular motion fingers.

In an embodiment, the jointed arm further includes a vacuum, electrostatic or magnetic gripper tool. With these the surface of the gripper is placed in contact with the object and either a magnetic field, electrostatic or a vacuum is applied to hold them in contact.

In an embodiment, the jointed arm includes a sander tool with a catch container. That is, as the sander sands a surface in the plasma chamber, byproduct shavings are trapped and prevented from falling towards the plasma chamber floor. In an embodiment, the jointed further includes a vacuum to trap the byproduct shavings and remove them from the chamber.

In an embodiment, the jointed robot arm robot further includes a set of sensors in order to determine the position of the arm within the plasma chamber. In one embodiment, the robot device includes a proximity sensor senses that indicates the presence of an object within a fixed space near the sensor without physical contact. In an embodiment, the robot device includes an acoustic sensor that senses and interprets acoustic waves. In an embodiment, the robot device includes a range sensor that measures the distance from a reference point to a set of points in the plasma chamber. Range can be sensed with a pair of TV cameras or sonar transmitters and receivers, or laser positioning sensors or eddy current sensors for precise metallic surface position sensing.

In an embodiment, the robot device includes a force sensor that measures the three components of the force and three components of the torque acting between two objects. In particular, a robot-wrist force sensor may measure the components of force and torque between the last link of the robot and its end-effectors by transmitting the deflection of the sensor's compliant sections, which results from the applied force and torque.

In an embodiment, the robot device includes a touch sensor that senses and indicates a physical contact between the object carrying the sensor and another object, such as a structure within the plasma chamber. For example, the touch sensor comprises a set of two plates held together by a spring. The two plates contact each other at three electrical contacts arranged in a triangle. These contacts are wired in series such that any motion of one plate relative to the other will cause the circuit to break and stop the robot device.

In an embodiment, the jointed arm robot further includes a sensory feedback mechanism. This may be measurement of insertion or gripping forces or may simply be a proximity sensor to say if anything is between the jaws of the gripper.

In an embodiment, the jointed arm robot can be programmed by either using a menu based system or simply using a text editor but the main characteristic of this method is the means by which the robot is taught the positional data. In an embodiment, a global co-ordinate system is used, in which the tool centre point of the robot device can be driven along the X, Y or Z axes of a global axis system (e.g., with reference to each plasma chamber).

In an embodiment, a tools co-ordinate system is used, which is similar to the global coordinate system, in which the axes are attached to the tool centre point of the robot and therefore move with it.

For example, once the plasma chamber is vented and opened, an appropriately positioned robot can home its arm(s) via special features on the preventive maintenance itself and then begin a wet clean cycle. Lab wipes, knitted polyester wipers, or other custom made abrasive pads can be picked tip or permanently mounted on the robot extention(s) (hands). These extensions can be moved over the inner chamber parts as desired. They can be precisely machined to reach the unreachable locations: hidden behind parts, sharp corners, thin gaps, holes smaller than a finger etc. Dry or wet wipes can be accommodated with dry pick and dip before wipe or dry pick wet tube delivery at point of use.

The robot's extension can be precisely placed in space while avoiding any interference that may be known from vendor 3D assembly drawings. The robot device can have the speed and pressure of the wipes be controlled to cover more complicated shapes with easier positioning (less precise) requirements. Optical feedback from self mounted lighting and simple LED or CCD camera may be used to determine number of wipe passes.

For example, the robot device will stop cleaning a portion of the plasma chamber surface once the yttria coating, which normally darkens with byproduct deposits, achieves a predetermined level of color (i.e., white), or has changed in color by a certain percentage from its initial un-cleaned state.

Figure 4:
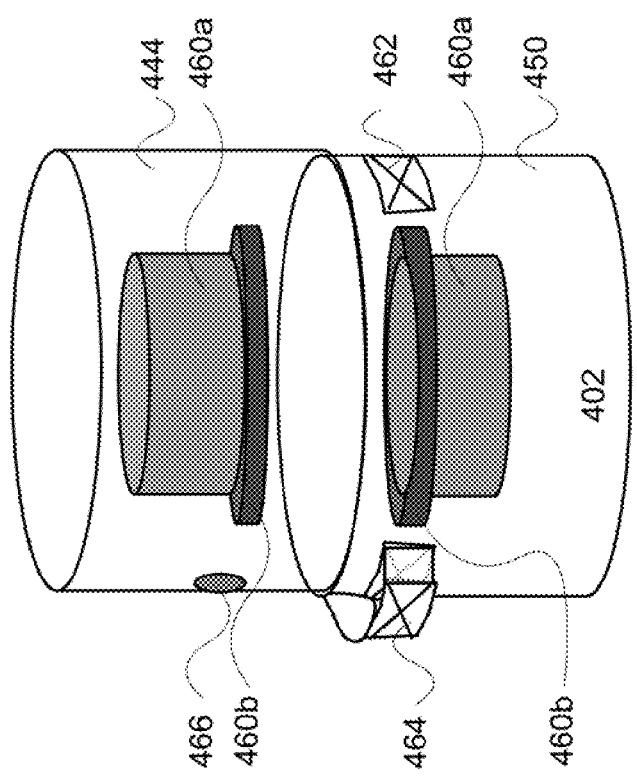
FIG. 4 illustrates a simplified diagram of a generic plasma processing system, according to one embodiment of the invention.

Referring now to FIG. 4, a simplified diagram of a generic plasma processing system is shown, according to one embodiment of the invention. Generally, the plasma chamber 402 is comprised of a bottom piece 450, a top piece 444. An appropriate set of gases may be flowed into plasma chamber 402 from gas distribution system (not shown). These plasma processing gases may be subsequently ionized at or in a region near injector (not shown) to form a plasma (not shown), in order to process (e.g., etch or deposition) exposed areas of substrate (not shown), such as a semiconductor substrate or a glass pane.

Aside from the surfaces of the plasma chamber which must be cleaned, structures within the plasma chamber that must also be cleaned are generally divided into a non removable structures 460a (i.e., fixed but not easily removable), and a removable structures 460b (i.e., fixed but easily removable, such as electrostatic chuck, quartz ring, etc.). Removable structures 460b may be gravity held (i.e., clear drop, bayonet twist, shelf supported) or electrostatically held (i.e., substrates, other parts, etc.) or by a set of accessible bolts. Plasma chamber 402 also may include a single vacuum compatible gate valve 462, and/or a double vacuum compatible gate valve 464, as well as vented chamber access.

Figure 5:
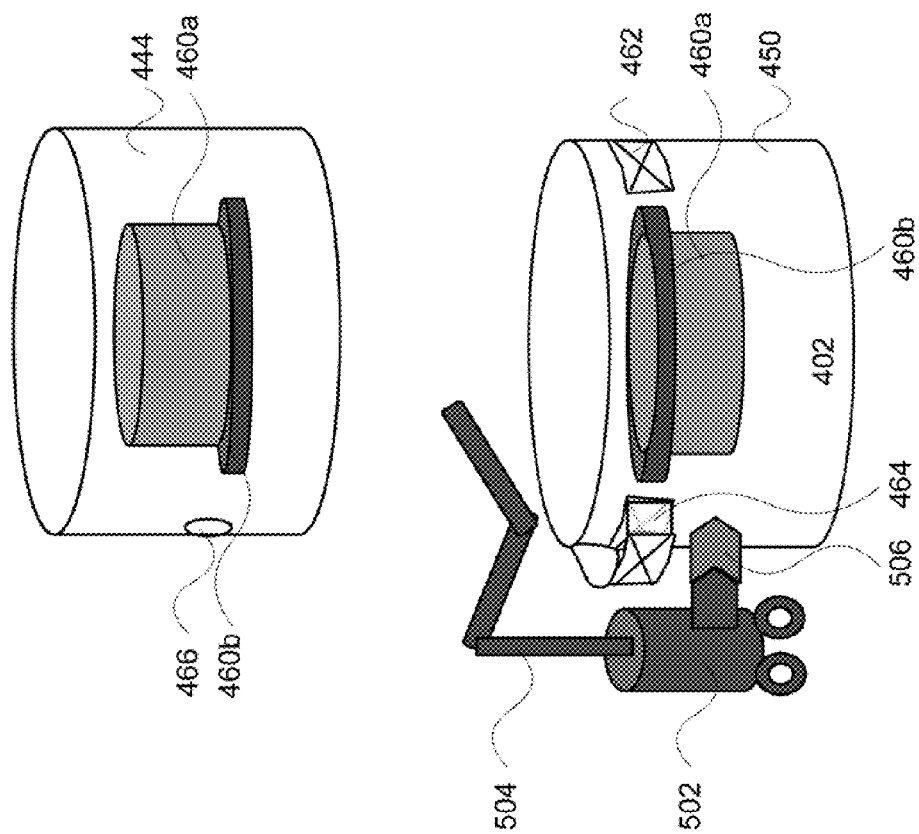
FIG. 5 illustrates the simplified diagram of an opened generic plasma processing system of FIG. 4, according to one embodiment of the invention

Referring now to FIG. 5, the simplified diagram of an opened generic plasma processing system of FIG. 4 is shown (i.e., the top piece has been lifted from the bottom piece), according to one embodiment of the invention. In this embodiment, robot device 502, with jointed arm 504, has been docked with a docking probe to docking port 506. In general, the docking port may comprise docking points with calibration points, that includes an optical alignment mechanism (laser proximity, image capture and processing), a magnetic alignment mechanism (electromagnets, permanent magnets, feedback on eddy current sensors), an alignment mechanism (such as optical component ball and slot configurations), a manual alignment mechanism, a robotic arm touch points mechanism, or a pressure based control mechanism.

Figure 6:
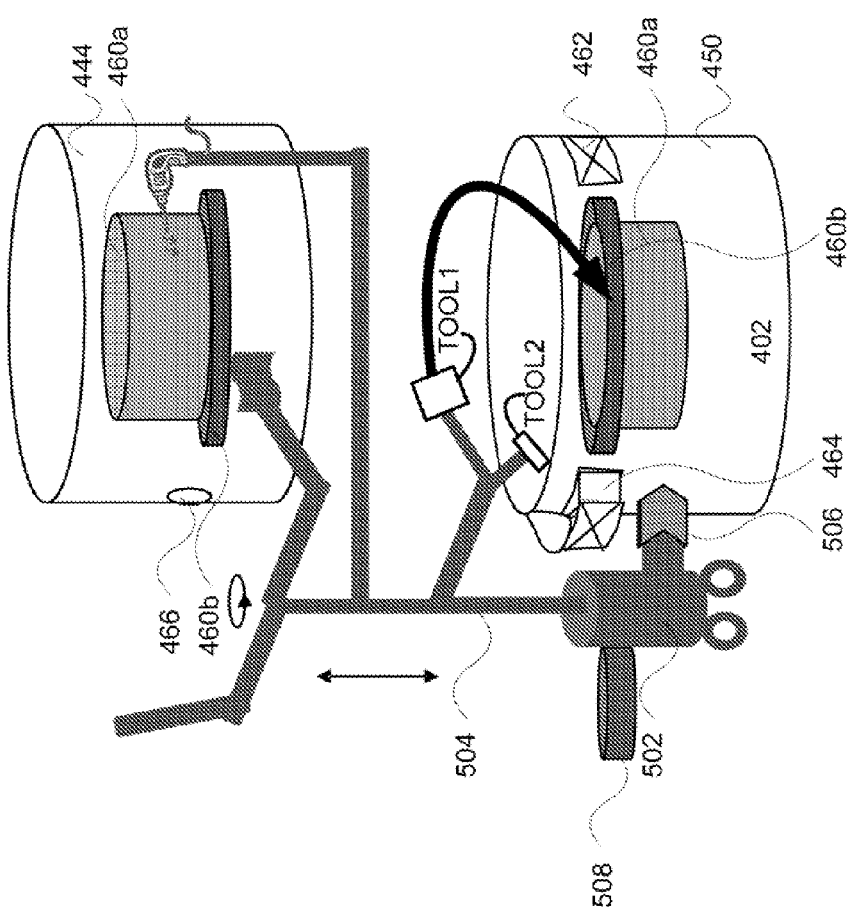
FIG. 6 illustrates the simplified diagram of an opened generic plasma processing system of FIG. 4 in which the robot device is performing a pre-programmed procedure, according to one embodiment of the invention; and, FIG. 7 illustrates the simplified diagram of a generic plasma processing system of FIG. 4 in which the robot device is performing a pre-programmed procedure in-situ, according to one embodiment of the invention.
Figure 7:
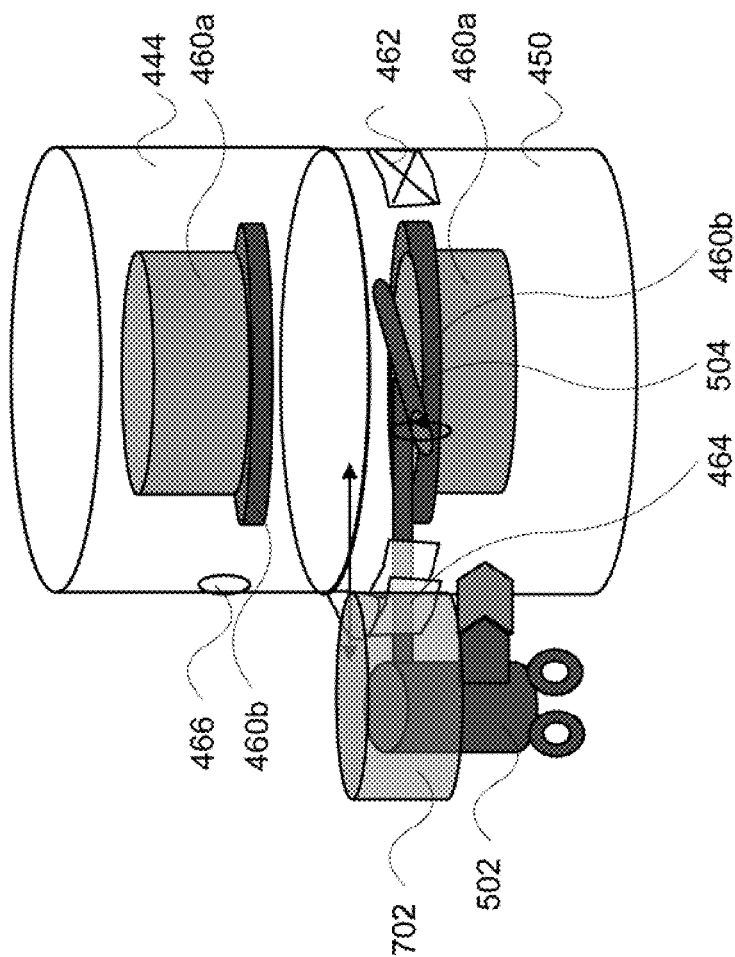

Referring now to FIG. 6, the simplified diagram of an opened generic plasma processing system of FIG. 4 is shown in which the robot device is performing a pre-programmed procedure, according to one embodiment of the invention. As previously state, unlike having an operator perform the procedure, robot device 502 can identically perform a set of best known methods (BKM) for removable consumables with given weight and geometry constraints. Robot device 502 can further clean the inside walls of plasma chamber 402 with either a wet or dry wipe. In addition, robot device can have a compartment for solvent delivery or reservoir 508 for programmed dipping, grinding with PVA brushes, or a vacuum for particulate elimination. In addition, jointed arm 504 may have a tool that may tighten bolts or unbolt parts to specific torque requirements either to meet specifications or to release consumables Referring now to FIG. 7 the simplified diagram of a generic plasma processing system of FIG. 4 is shown in which the robot device is performing a pre-programmed procedure in-situ, according to one embodiment of the invention. In this embodiment, robot device 502 includes a vacuum sub-chamber 702 for docking with single vacuum compatible gate valve 462, and/or a double vacuum compatible gate valve 464, for maintenance in vacuum or ambient (e.g., no $H_2O$ vapor exposure which changes deposit properties by hydrolysis or absorption, or Ar or $N_2$ or $H_2$ or $O_2$ ambient, etc.)

While this invention has been described in terms of several preferred embodiments, there are alterations, permutations, and equivalents which fall within the scope of this invention. It should also be noted that there are many alternative ways of implementing the methods of the present invention.

Advantages of the invention include an apparatus for servicing a plasma processing system with a robot. Additional advantages include substantially removing human error and variability; lowering MTTC (mean time between cleaning) and MTTR (mean time to replacement) post clean; allowing to use of highly effective cleaning materials that would normally be too dangerous for an operator; enabling quick service of parts with large number of bolts, especially when required to torque to spec; enabling the handling contaminated and hot parts; enabling the removal of parts with potential particulate formation if exposed to air; enabling handling parts that are too heavy or cumbersome for single individual (reduce cost or enable larger parts changing); enabling precision placement of gravity supported parts (e.g., tall tightly toleranced concentric tubes with large connecting radii (focus rings), etc.); reducing the chipping of delicate parts often a problem during installation; and enabling well controlled release of changed procedures over entire fab (or controlled release on specific modules).

Having disclosed exemplary embodiments and the best mode, modifications and variations may be made to the disclosed embodiments while remaining within the subject and spirit of the invention as defined by the following claims.

The invention claimed is:

1. A method of servicing a plasma processing system, the plasma processing system including at least a plasma chamber, the method comprising:
   docking a robot device to a docking port of the plasma processing system, the docking of the robot device to the docking port including aligning a docking probe of the robot device with a docking port of the plasma processing system using one or more alignment mechanisms, thereby aligning the robot device with the plasma chamber, the robot device being coupled to an ambulatory platform;
   using the robot device to control a lift mechanism to lift a to piece of the plasma processing system relative to a bottom piece of the plasma chamber;
   extending a first member of the robot device into an opening between the to piece and the bottom piece of the plasma chamber; and
   after the extending, performing a set of tasks according to a set of procedures.

2. The method of claim 1 wherein the set of tasks includes at least cleaning at least a set of inside walls of the plasma chamber, the method further comprising stopping the cleaning when a color of a surface of the set of inside wall of the plasma chamber matches a reference sample color.

3. The method of claim 1 wherein the set of tasks includes at least removing a plasma chamber part inside the plasma chamber.

4. The method of claim 1 wherein the set of tasks includes at least placing a plasma chamber part inside the plasma chamber.

5. The method of claim 1 wherein the set of tasks includes at least aligning a plasma chamber part inside the plasma chamber.

6. The method of claim 1 wherein the set of tasks includes performing programmed dipping inside the plasma chamber.

7. The method of claim 1 wherein the set of tasks includes performing grinding with brushes inside the plasma chamber.

8. The method of claim 1 wherein the set of tasks includes performing vacuuming for removing particles from inside of the plasma-chamber.

9. The method of claim 1 further comprising determining a set of weight and geometry constraints, wherein the set of tasks includes at least removing consumable structures from inside of the plasma chamber according to the set weight and geometry constraints.

10. The method of claim 1 further comprising determining a set of torque requirements, wherein the set of tasks includes at least tightening a set of bolts inside the plasma chamber according to the set of torque requirements.

11. A method of servicing a plasma processing system, the plasma processing system including at least a plasma chamber, the plasma chamber including at least a top piece and a bottom piece, the top piece being disposed above the bottom piece, the method comprising:
    docking a robot device to a docking port of the plasma processing system, the docking of the robot device to the docking port including aligning a docking probe of the robot device with a docking port of the plasma processing system using one or more alignment mechanisms, thereby aligning the robot device with the plasma chamber, the robot device being coupled to an ambulatory platform;
    using the robot device to control a lift mechanism to lift the top piece from the bottom piece;
    extending a first member of the robot device into the top piece to perform a first set of tasks according to a first set of service procedures; and
    extending a second member of the robot device into the bottom piece to perform a second set of tasks according to a second set of service procedures.

12. The method of claim 11 wherein the first set of tasks includes at least cleaning at least a set of inside walls of the top piece using a cleaning pad, the method further comprising stopping the cleaning when a measured friction between the cleaning pad and a surface of the set of inside walls of the top piece becomes less than a specified value.

13. The method of claim 11 wherein the first set of tasks includes at least removing a plasma chamber part inside the top piece.

14. The method of claim 11 wherein the first set of tasks includes at least placing a plasma chamber part inside the top piece.

15. The method of claim 11 wherein the first set of tasks includes at least aligning a plasma chamber part inside the top piece.

16. The method of claim 11 wherein the first set of tasks includes performing programmed dipping inside the top piece.

17. The method of claim 11 wherein the first set of tasks includes performing grinding with brushes inside the top piece.

18. The method of claim 11 wherein the first set of tasks includes performing vacuuming for removing particles from inside of the top piece.

19. The method of claim 11 further comprising determining a set of weight and geometry constraints, wherein the first set of tasks includes at least removing consumable structures from inside of the top piece according to the set of weight and geometry constraints.

20. The method of claim 11 further comprising determining a set of torque requirements, wherein the first set of tasks includes at least tightening a set of bolts inside the top piece according to the set of torque requirements.

* * * * *